(12) United States Patent
Morishita

(10) Patent No.: US 10,332,721 B2
(45) Date of Patent: Jun. 25, 2019

(54) ABERRATION COMPUTING DEVICE, ABERRATION COMPUTING METHOD, IMAGE PROCESSOR, IMAGE PROCESSING METHOD, AND ELECTRON MICROSCOPE

(71) Applicant: JEOL Ltd., Tokyo (JP)

(72) Inventor: Shigeyuki Morishita, Tokyo (JP)

(73) Assignee: JEOL Ltd., Tokyo (JP)

( * ) Notice: Subject to any disclaimer, the term of this patent is extended or adjusted under 35 U.S.C. 154(b) by 553 days.

(21) Appl. No.: 14/706,308

(22) Filed: May 7, 2015

(65) Prior Publication Data

US 2016/0041064 A1 Feb. 11, 2016

(30) Foreign Application Priority Data

May 8, 2014 (JP) .................................. 2014-96832

(51) Int. Cl.
| | |
|---|---|
| *G01M 11/02* | (2006.01) |
| *H01J 37/26* | (2006.01) |
| *H01J 37/153* | (2006.01) |
| *H01J 37/295* | (2006.01) |

(52) U.S. Cl.
CPC ......... *H01J 37/26* (2013.01); *G01M 11/0257* (2013.01); *G01M 11/0292* (2013.01); *H01J 37/153* (2013.01); *H01J 37/295* (2013.01); *H01J 2237/153* (2013.01); *H01J 2237/1532* (2013.01); *H01J 2237/282* (2013.01)

(58) Field of Classification Search
None
See application file for complete search history.

(56) References Cited

U.S. PATENT DOCUMENTS

| | | | | |
|---|---|---|---|---|
| 5,300,776 | A  * | 4/1994 | Krivanek ................ | H01J 37/21 250/307 |
| 2008/0011949 | A1* | 1/2008 | Sannomiya ........... | H01J 37/153 250/311 |
| 2016/0225576 | A1* | 8/2016 | Kohno .................. | H01J 37/141 |

OTHER PUBLICATIONS

J. Barthel, A. Thust, entitled "Aberration measurement in HRTEM: Implementation and diagnostic use of numerical procedures for the highly precise recognition of diffractogram patterns", Ultramicroscopy, 2010, pp. 27-46, 111.

M. Vulovic et al., entitled "Precise and unbiased estimation of astigmatism and defocus in transmission electron microscopy", Ultramicroscopy, 2012, pp. 115-134, 116.

* cited by examiner

*Primary Examiner* — Robert K Carpenter
(74) *Attorney, Agent, or Firm* — The Webb Law Firm

(57) ABSTRACT

An aberration computing device (100) includes a fitting section (48) for fitting line profiles of a diffractogram taken in radial directions to a fitting function and finding fitting parameters of the fitting function and a computing section (49) for finding at least one of an amount of defocus and two-fold astigmatism, based on the fitting parameters.

10 Claims, 13 Drawing Sheets

ABERRATION COMPUTING DEVICE, ABERRATION COMPUTING METHOD, IMAGE PROCESSOR, IMAGE PROCESSING METHOD, AND ELECTRON MICROSCOPE

BACKGROUND OF THE INVENTION

Field of the Invention

The present invention relates to an aberration computing device, aberration computing method, image processor, image processing method, and electron microscope.

Description of Related Art

A diffractogram indicative of Fourier transformed intensities of an amorphous image is used as a means for detecting defocus and two-fold astigmatism in transmission electron microscopy. A technique for quantitatively measuring defocus and two-fold astigmatism based on the diffractogram is important in making aberration corrections and in other similar applications.

For example, J. Barthel, A. Thust, Ultramicroscopy 111, pp. 27-46 (2010) discloses a technique for finding defocus and two-fold astigmatism by two-dimensional pattern fitting of a diffractogram. In particular, in preprocessing a diffractogram, the background is removed and an envelope function is complemented. Then, the binarized diffractogram is compared against a database, thus roughly measuring defocus and two-fold astigmatism. Then, pattern fitting of experimental data about the diffractogram to simulation results is done by using the covariance on a serpentine path as a degree of similarity. Values of the defocus and two-fold astigmatism are found by performing the pattern fitting while varying three parameters of the defocus and two-fold astigmatism (x and y).

M. Vulovic et al., Ultramicroscopy 116, pp. 115-134 (2012) discloses a technique of finding defocus and two-fold astigmatism by template matching. In particular, the S/N is improved by periodgram averaging as a pretreatment. Then, the background is reduced by taking a logarithm of the signal. Furthermore, the intensity is inverted by multiplying the signal by a second-order Gaussian differential filter. After the diffractogram is transformed into polar coordinates, the coordinates are transformed into a three-dimensional parameter space using template matching and a maximum value is detected. By finding the position of a maximum value in this way and plotting the ellipticity relative to the spatial frequency, defocus and two-fold astigmatism are measured.

In the technique of the above-cited J. Barthel, A. Thust, Ultramicroscopy 111, pp. 27-46 (2010), however, two-dimensional pattern fitting is applied to a diffractogram. In the technique of the above-cited M. Vulovic et al., Ultramicroscopy 116, pp. 115-134 (2012), a diffractogram is transformed into polar coordinates and then into a three-dimensional space. In this way, the techniques of J. Barthel, A. Thust, Ultramicroscopy 111, pp. 27-46 (2010) and M. Vulovic et al., Ultramicroscopy 116, pp. 115-134 (2012) involve computations in higher dimensions and so there is the problem that the computational speed is low, especially where the image size is large.

SUMMARY OF THE INVENTION

In view of the foregoing problem, the present invention has been made. One object associated with some aspects of the present invention is to provide an aberration computing device, aberration computing method, image processor, and image processing method permitting computations to be performed at higher speeds. It is another object associated with some aspects of the invention to provide an electron microscope including this aberration computing device or this image processor.

(1) An aberration computing device associated with the present invention includes: a fitting section for fitting line profiles of a diffractogram taken in radial directions to a fitting function and finding fitting parameters of the fitting function; and a computing section for finding at least one of an amount of defocus and two-fold astigmatism, based on the fitting parameters.

In this aberration computing device, at least one of an amount of defocus and two-fold astigmatism is found based on the fitting parameters of the fitting function obtained by fitting the line profiles of the diffractogram taken in radial directions to the fitting function. Therefore, the amount of computation can be reduced as compared to the case where higher-order computations are performed to find the amount of defocus and two-fold astigmatism. Consequently, the computation for finding at least one of the amount of defocus and two-fold astigmatism can be carried out at higher speed.

(2) In one feature of this aberration computing device, the fitting function may include a contrast transfer function.

In this aberration computing device, the computation for finding at least one of the amount of defocus and two-fold astigmatism can be accelerated.

(3) In another feature of this aberration computing device, the fitting section may fit valley regions and their vicinities of the line profiles to the fitting function.

The fitting parameters used to find defocus and two-fold astigmatism depend chiefly on the profile portions of the line profiles in the valley regions. Consequently, the aberration computing device can accurately find the fitting parameters by fitting the valley regions and their vicinities of the line profiles.

(4) In a further feature of this aberration computing device, the fitting section may carry out the fitting by a least squares method by assigning weights inversely proportional to the intensity of the diffractogram or inversely proportional to the square of the intensity.

In this aberration computing device, the valley regions and their vicinities of the diffractogram can be fitted to the fitting function and so the fitting parameters can be found accurately.

(5) In a yet other feature of this aberration computing device, the fitting section may find the fitting parameters respectively for the plural line profiles which are different in azimuthal angle. The computing section may find at least one of an amount of defocus and two-fold astigmatism, based on the plural fitting parameters found by the fitting section.

In this aberration computing device, at least one of the amount of defocus and two-fold astigmatism can be found accurately.

(6) In a yet further feature of this aberration computing device, the device may further include an image processor for filtering the diffractogram in a circumferential direction.

In this aberration computing device, the SN of the diffractogram can be improved while suppressing the positions of the rings from deviating in radial directions as compared to the case where the diffractogram is filtered isotropically.

(7) In an additional feature of this aberration computing device, the image processor may transform the diffractogram into polar coordinates and convolve the diffractogram in polar coordinate representation with an anisotropic filter function.

In this aberration computing device, the diffractogram can be filtered in a circumferential direction.

(8) In a still other feature of this aberration computing device, the image processor may find two-fold astigmatism in the diffractogram, normalize the diffractogram with the two-fold astigmatism, and transform the normalized diffractogram into polar coordinates.

In this aberration computing device, if the rings of the diffractogram are concentrically elliptical, the diffractogram can be filtered in a circumferential direction of the rings. Consequently, the SN of the diffractogram can be improved efficiently.

(9) An aberration computing method associated with the present invention starts with fitting line profiles of a diffractogram taken in radial directions to a fitting function to find fitting parameters of the fitting function. Then, at least one of an amount of defocus and two-fold astigmatism is found, based on the fitting parameters.

In this aberration computing method, at least one of an amount of defocus and two-fold astigmatism is found, based on the fitting parameters of the fitting function obtained by fitting line profiles of the diffractogram taken in radial directions. Therefore, the amount of computation can be reduced as compared to the case where higher-order computations are performed to find an amount of defocus and two-fold astigmatism. The computation for finding at least one of an amount of defocus and two-fold astigmatism can be accelerated.

(10) In one feature of this aberration computing method, the fitting function may include a contrast transfer function.

In this aberration computing method, the computation for finding at least one of an amount of defocus and two-fold astigmatism can be accelerated.

(11) In another feature of this aberration computing method, during the step of fitting the line profiles, the valley regions and their vicinities of the line profiles may be fitted to the fitting function.

In this aberration computing method, the fitting parameters can be found accurately by fitting the valley regions and their vicinities of the line profiles to the fitting function.

(12) In a further feature of this aberration computing method, the step of fitting the line profiles may be carried out by a least squares method by assigning weights inversely proportional to the intensity of the diffractogram or inversely proportional to the square of the intensity.

In this aberration computing method, the valley regions and their vicinities of the diffractogram can be fitted to the fitting function and so the fitting parameters can be found accurately.

(13) In an additional feature of this aberration computing method, during the step of fitting the line profiles, the fitting parameters may be found respectively for the line profiles which are different in azimuthal angle. During the step of finding at least one of an amount of defocus and two-fold astigmatism, at least one of them may be found, based on the fitting parameters found by the step of fitting the line profiles.

In this aberration computing method, at least one of an amount of defocus and two-fold astigmatism can be found accurately.

(14) In a yet other feature of this aberration computing method, there may be further provided the step of performing image processing such that the diffractogram is filtered in a circumferential direction.

In this aberration computing/method, the S/N of the diffractogram ban be improved while suppressing the positions of the rings from deviating in radial directions as compared to the case where the diffractogram is filtered isotropically.

(15) In an additional feature of this aberration computing method, during the step of performing image processing, the diffractogram may be transformed into polar coordinates and convolved with an anisotropic filter function.

In this aberration computing method, the diffractogram can be filtered in a circumferential direction, and the positions of the rings can be suppressed from deviating in radial directions as compared to the case where the diffractogram is filtered isotropically.

(16) In a still other feature of this aberration computing method, during the step of performing image processing, two-fold astigmatism in the diffractogram may be found, and the diffractogram may be normalized with the two-fold astigmatism and transformed into polar coordinates.

In this aberration computing method, if the rings of the diffractogram are coaxially elliptical, the line profiles can be filtered in a circumferential direction of the rings and, therefore, the S/N of the diffractogram can be improved efficiently.

(17) An image processor associated with the present invention includes an image processing portion for filtering a diffractogram or a diffraction pattern in a circumferential direction.

For example, if a diffractogram is filtered isotropically in an attempt to improve the S/N of the diffractogram, the rings of the diffractogram may be blurred. As a result, the positions of the rings may deviate in radial directions.

In this image processor, the diffractogram or diffraction pattern is filtered in a circumferential direction by the image processing portion and so the positions of the rings can be suppressed from deviating in radial directions compared with the case where the diffractogram or diffraction pattern is filtered isotropically. Furthermore, where a diffractogram or diffraction pattern is filtered isotropically, the rings may be blurred, resulting in a decrease in the contrast. In contrast, where a diffractogram or diffraction pattern is filtered in a circumferential direction, regions of similar intensity blur together and, therefore, high contrast can be maintained. Consequently, in this image processor, the S/N of the diffractogram or diffraction pattern can be improved while, suppressing the positions of the rings from deviating in radial directions.

(18) In one feature of this image processor, the image processing portion may transform the diffractogram or diffraction pattern into polar coordinates and convolve the diffractogram or diffraction pattern in polar coordinate representation with an anisotropic filter function.

In this image processor, the diffractogram or diffraction pattern can be filtered in a circumferential direction. The positions of the rings can be suppressed from deviating in radial directions as compared to the case where the diffractogram or diffraction pattern is filtered isotropically.

(19) In a further feature of this image processor, the image processing portion may find two-fold astigmatism in the diffractogram, normalize the diffractogram with the two-fold astigmatism, and transform the normalized diffractogram into polar coordinates.

In this image processor, if the rings of the diffractogram or diffraction pattern are coaxially elliptic, the diffractogram or diffraction pattern can be filtered in a circumferential direction of the rings and, therefore, the S/N of the diffractogram or diffraction pattern can be improved efficiently.

(20) An image processing method associated with the present invention comprises the step of performing image processing such that a diffractogram or a diffraction pattern is filtered in a circumferential direction.

In this image processing method, the S/N of the diffractogram or diffraction pattern can be improved while suppressing the positions of the rings from deviating in radial directions as compared to the case where the diffractogram or diffraction pattern is filtered isotropically.

(21) In one feature of this image processing method, during the step of performing image processing, the diffractogram or diffraction pattern may be transformed into polar coordinates and convolved with an anisotropic filter function.

In this image processing method, the diffractogram or diffraction pattern can be filtered in a circumferential direction. The positions of the rings can be suppressed from deviating in radial directions compared with the case where the diffractogram or diffraction pattern is filtered isotropically.

(22) In another feature of this image processing method, during the step of performing image processing, two-fold astigmatism in the diffractogram may be found and the diffractogram may be normalized with the two-fold astigmatism and transformed into polar coordinates.

In this image processing method, if the rings of the diffractogram or diffraction pattern are concentrically elliptical, the diffractogram or diffraction pattern can be filtered in a circumferential direction of the rings. Consequently, the (signal to noise ratio) S/N of the diffractogram or diffraction pattern can be improved efficiently.

(23) An electron microscope associated with the present invention includes an aberration computing device associated with the present invention.

This electron microscope can include the aberration computing device capable of computing at least one of an amount of defocus and two-fold astigmatism at higher speed.

(24) In one feature of this electron microscope, the microscope includes an image processor associated with the present invention.

This electron microscope can include the image processor that can improve the S/N of the diffractogram or diffraction pattern while suppressing the positions of the rings from deviating in radial directions.

DESCRIPTION OF THE INVENTION

The preferred embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

1. First Embodiment 1.1. Aberration Computing Device and Electron Microscope

Figure 1:
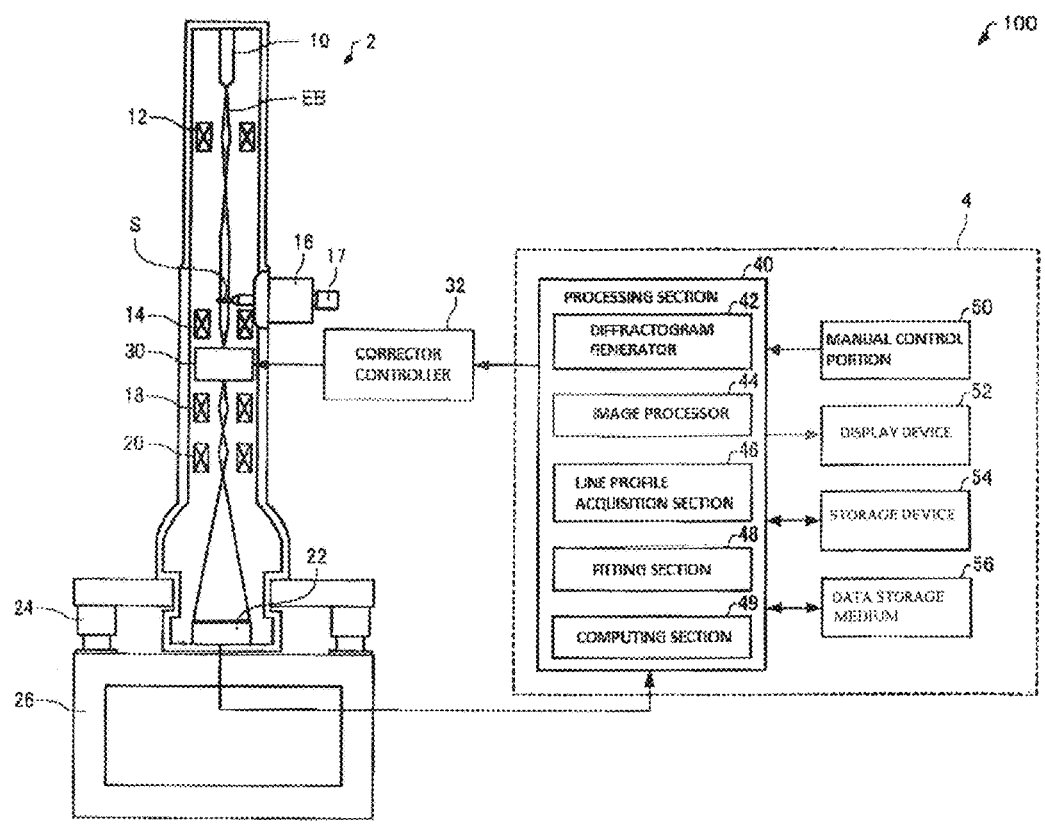
FIG. 1 is a vertical cross section, partly in block form, of an electron microscope including an aberration computing device associated with a first embodiment of the present invention.

An aberration computing device and electron microscope associated with a first embodiment of the present invention is first described by referring to FIG. 1, which schematically shows the configuration of the electron microscope, 100, including the aberration computing device, 4. As shown in FIG. 1, the electron microscope 100 includes a microscope body 2 and the aberration computing device 4.

For example, the electron microscope 100 is a transmission electron microscope that is an instrument for imaging electrons transmitted through a sample S to obtain transmission electron microscope (TEM) images including bright field images, dark field images, diffraction patterns, and so on.

(1) Electron Microscope Body

The electron microscope body 2 is first described. The microscope body 2 includes an electron beam source 10, a condenser lens system 12, an objective lens 14, a sample stage 16, an intermediate lens 18, a projector lens 20, an imager 22, an aberration corrector 30, and an aberration corrector controller 32.

The electron beam source 10 produces an electron beam EB by accelerating electrons by means of an anode after the electrons are emitted by a cathode. An electron gun can be used as the electron beam source 10. No restrictions are imposed on the electron gun used as the electron beam source 10. For example, a thermionic electron gun, a thermal field-emission electron gun, a cold field emission gun, or other electron gun can be used.

The condenser lens system 12 is located behind (on the downstream side relative to the direction of the electron beam EB) the electron beam source 10 and used to focus the electron beam EB produced by the electron beam source 10 onto the sample S. The condenser lens system 12 may be configured including plural lenses (not shown).

The objective lens 14 is disposed behind the condenser lens system 12. The objective lens 14 is an initial stage of lens for imaging the electron beam EB transmitted through the sample S and has an upper polepiece and a lower polepiece (none of which are shown). The objective lens 14 produces a magnetic field between the upper and lower polepieces to focus the beam EB.

The sample stage 16 holds the sample S. In the illustrated example, the sample stage 16 holds the sample S via a sample holder 17. For example, the sample stage 16 places the sample S between the upper and lower polepieces of the objective lens 14. The sample stage 16 can place the sample S in position by moving and stopping the sample holder 17. The sample stage 16 can move the sample S in a horizontal direction perpendicular to the direction of travel of the electron beam EB and also in a vertical direction along the direction of travel of the beam EB. Furthermore, the sample stage 16 can tilt the sample S.

In the illustrated example, the sample stage 16 is a side-entry stage for inserting the sample S from a side of the polepieces (not shown) of the objective lens 14. Alternatively, the sample stage 16 may be a top-loading stage (not shown) for inserting the sample S from above the polepieces of the objective lens 14.

The intermediate lens 18 is located behind the objective lens 14. The projector lens 20 is disposed behind the intermediate lens 18. The intermediate lens 18 and projector lens 20 further magnify the image focused by the objective lens 14 and focus the image onto the imager 22. In the electron microscope 100, the objective lens 14, intermediate lens 18, and projector lens 20 together constitute an imaging lens system.

The imager 22 captures the TEM image focused by the imaging lens system. For example, the imager 22 is a digital camera such as a CCD camera. The imager 22 outputs information about the captured TEM image to the aberration computing device 4.

The aberration corrector 30 is disposed behind the objective lens 14. More specifically, the corrector 30 is disposed between the objective lens 14 and the intermediate lens 18. The aberration corrector 30 is an instrument for correcting aberration in the objective lens 14. The corrector 30 corrects higher-order aberrations such as spherical aberration and star aberration in the objective lens 14 by producing a given magnetic field. For example, the corrector 30 corrects spherical aberration in the objective lens 14 by producing negative spherical aberration so as to cancel out positive spherical aberration in the objective lens 14. The aberration corrector 30 is under control of the aberration corrector controller 32.

The corrector controller 32 controls the aberration corrector 30, based on information about the amount of defocus and two-fold astigmatism found by the aberration computing device 4. For example, the corrector controller 32 creates a control signal for correcting higher-order aberrations by the use of a diffractogram tableau from information about the amount of defocus and two-fold astigmatism obtained from plural diffractograms and sends the signal to the aberration corrector 30. In response to the control signal, the aberration corrector 30 produces the given magnetic field, thus correcting high-order aberrations. In the illustrated example, the electron microscope body 2 is mounted on a pedestal 26 via vibration isolators 24.

(2) Aberration Computing Device

The aberration computing device 4 is next described. This computing device 4 creates a diffractogram from a TEM image taken by the electron microscope body 2 and finds an amount of defocus and two-fold astigmatism from the created diffractogram. A diffractogram referred to herein is a diagram obtained by Fourier transforming a high-magnification image of an amorphous sample. The aberration computing device 4 includes a processing section 40, a manual control portion 50, a display device 52, a storage device 54, and a data storage medium 56.

The manual control portion 50 obtains a manual control signal responsive to a user's manipulation or action and sends the signal to the processing section 40. The manual control portion 50 is made, for example, of buttons, keys, a touch panel display, or a microphone.

The display device 52 provides a display of the image generated by the processing section 40. The function of the display device 52 can be implemented by an LCD, CRT, or the like. The display device 52 can display diffractograms, for example, created by the processing section 40. Furthermore, the display device 52 can provide a display of information about the amount of defocus and two-fold astigmatism, for example, found by the processing section 40.

The storage device 54 acts as a working area for the processing section 40. The function of the storage device 54 can be implemented by a RAM or the like. The storage device 54 stores programs, data, and other related information permitting the processing section 40 to perform various kinds of computational processing and control operations. The processing section 40 is also used to temporarily store the results of computations executed in accordance with various programs.

The data storage medium 56 is a computer-readable medium and stores programs, data, and related information. The function of the storage medium 56 can be implemented by an optical disc (such as a CD or DVD), a magnetooptical disc (MO), magnetic disc, hard disc, magnetic tape, or memory (such as a ROM). The processing section 40 performs various kinds of processing of the present embodiment based on programs and data stored in the data storage medium 56. The storage medium 56 can store computer programs for causing a computer to act as various parts of the processing section 40.

The processing section 40 performs various computational operations in accordance with computer programs stored in the storage device 54. The processing unit 40 operates as a diffractogram generator 42, an image processor 44, a line profile acquisition section 46, a fitting section 48, and a computing section 49 as described below by executing programs stored in the storage device 54. The functions of the processing section 40 can be implemented by hardware such as various processors (e.g., a CPU or DSP), an ASIC (such as a gate array), or computer programs. At least a part of the processing section 40 may be implemented by hardware such as dedicated circuitry. The processing section 40 includes the diffractogram generator 42, image processor 44, line profile acquisition section 46, fitting section 48, and computing section 49.

Figure 2:
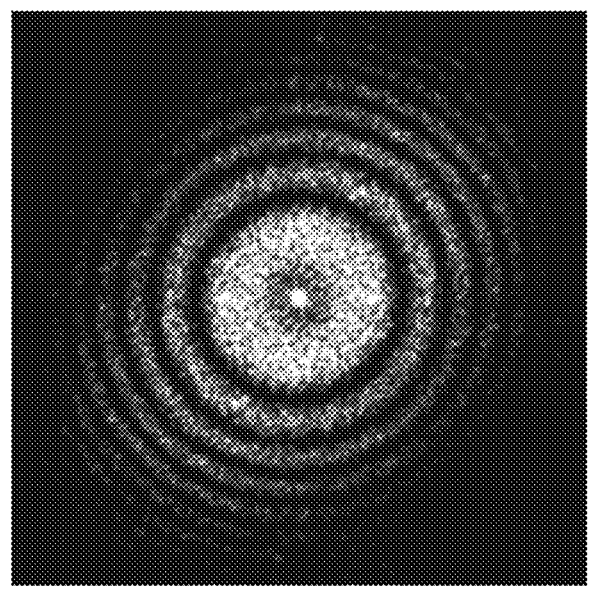
FIG. 2 shows one example of diffractogram.

The diffractogram generator 42 creates a diffractogram by Fourier transforming a transmission electron microscope image (bright field image) of the sample S taken by the electron microscope body 2. It is herein assumed that the sample S is an amorphous sample. Information about the TEM image of the sample S is output from the imager 22 to the diffractogram generator 42 of the aberration computing device 4. FIG. 2 shows one example of diffractogram created by the diffractogram generator 42. It is observed from FIG. 2 that a series of concentric rings indicating bright and dark portions (i.e., varying degrees of magnitude) of the diffractogram appears as an annular pattern about the center of the diffractogram.

The image processor 44 operates such that the diffractogram created by the diffractogram generator 42 is low pass filtered in a circumferential direction (i.e., along a circumference). Consequently, the S/N of the diffractogram can be improved. The processing performed by the image processor 44 is described in detail below.

Figure 3:
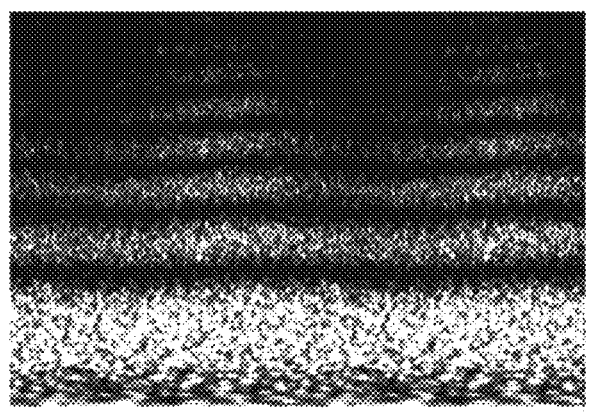
FIG. 3 shows one example of diffractogram transformed in polar coordinates.
Figure 3:

The image processor 44 transforms the diffractogram in an orthogonal coordinate system generated by the diffractogram generator 42 into polar coordinates. FIG. 3 shows one example of diffractogram transformed in polar coordinates. In the diffractogram of FIG. 3 in polar coordinate representation, the horizontal axis indicates azimuthal angle (declination) θ, while the vertical axis indicates the distance r from the center of the diffractogram. The coaxial rings of the diffractogram represented by an orthogonal coordinate system shown in FIG. 2 are belt-like lines extending straight along the horizontal axis in the diffractogram of FIG. 3 represented in polar coordinates.

Figure 4:
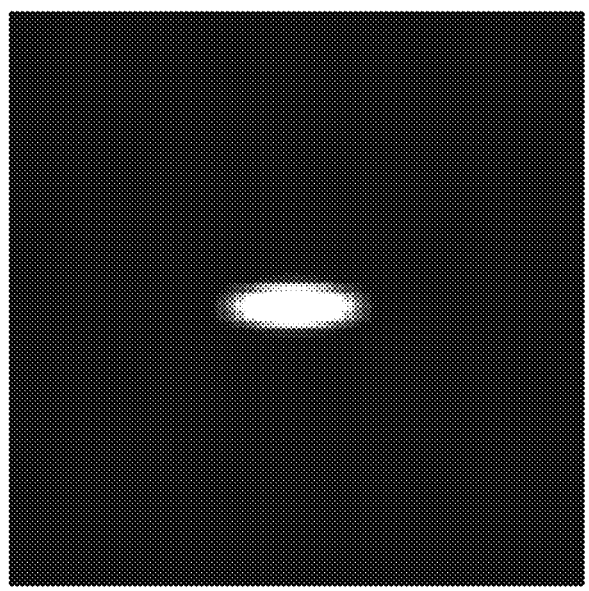
FIG. 4 shows one example of an anisotropic filter function.
Figure 5:
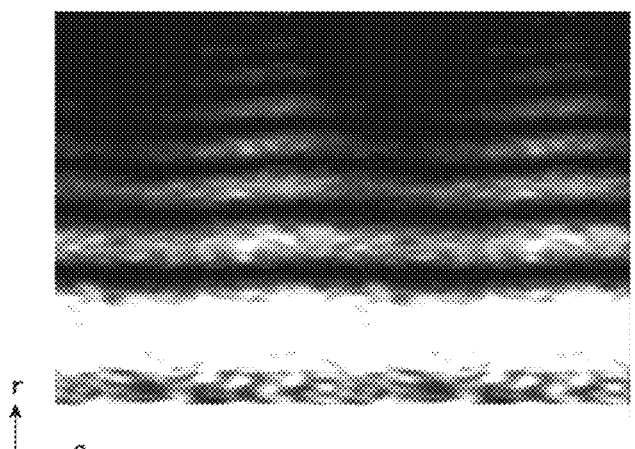
FIG. 5 shows one example of diffractogram filtered along the horizontal axis and in polar coordinate representation.

The image processor 44 convolves the diffractogram represented in polar coordinates with an anisotropic filter function extending along the horizontal axis. FIG. 4 shows one example of the anisotropic filter function extending along the horizontal axis. As a result, the diffractogram transformed in polar coordinates can be low pass filtered along the horizontal axis. FIG. 5 shows one example of the diffractogram which is represented in polar coordinates and which has been filtered along the horizontal axis. Filtering a polar coordinate diffractogram along the horizontal axis is equivalent to filtering an orthogonal coordinate diffractogram in a circumferential direction.

Figure 6:
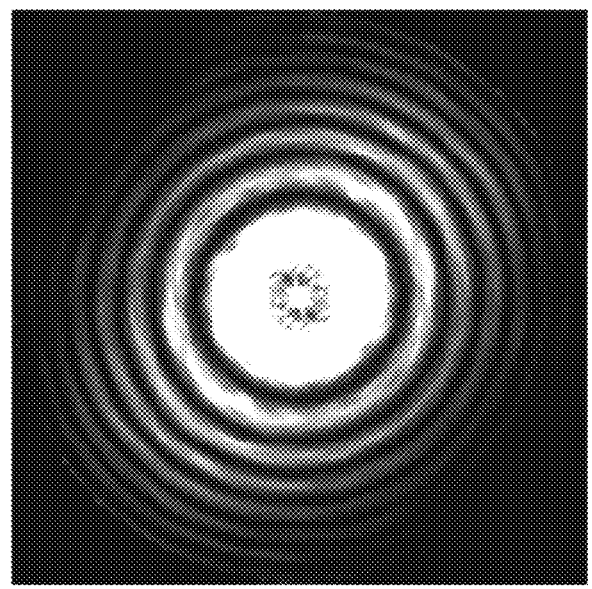
FIG. 6 shows one example of diffractogram transformed in an orthogonal coordinate representation from a diffractogram which is filtered along the horizontal axis and which is in polar coordinate representation.

The image processor 44 operates such that the diffractogram represented in polar coordinates and filtered along the horizontal axis is returned to the original format, i.e., represented in orthogonal coordinates. FIG. 6 shows one example of the diffractogram obtained by transforming the diffractogram represented in polar coordinates and filtered along the horizontal axis into an orthogonal coordinate representation. As shown in FIG. 6, the diffractogram can be filtered in a circumferential direction by the above-described processing performed by the image processor 44.

Figure 7:
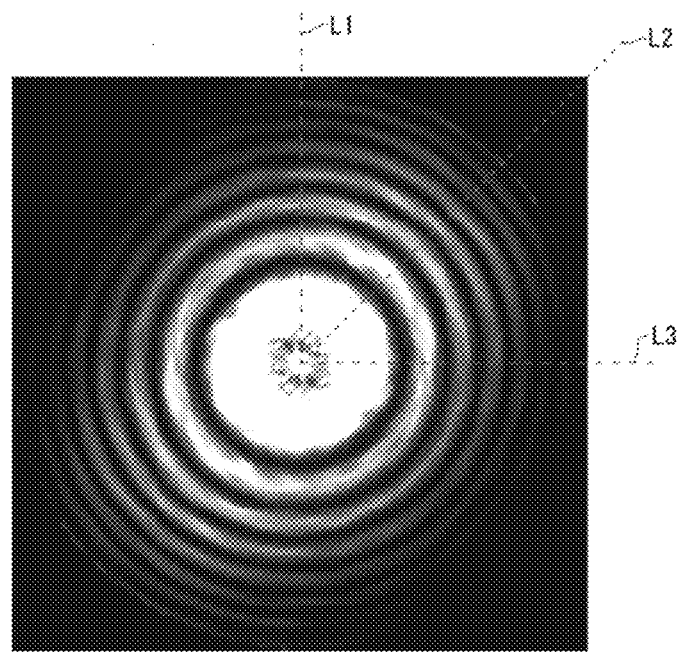
FIG. 7 shows a diffractogram, and in which lines extend from the center of the diffractogram in radial directions.

The line profile acquisition section 46 obtains line profiles of the diffractogram in radial directions, the diffractogram being filtered in a circumferential direction by the image processor 44. FIG. 7 shows lines L1, L2, and L3 extending from the center of the diffractogram in radial directions. The line profile acquisition section 46 draws the lines L1, L2, and L3 from the center of the diffractogram in radial directions as shown in FIG. 7 and obtains line profiles (intensity profiles) of the lines L1, L2, and L3 which provide information about the positions in the radial directions and the intensities at these positions. That is, the line profile acquisition section 46 obtains line profiles of the lines L1, L2, and L3 which are different in azimuthal angle (declination) θ.

In this example, the line profile acquisition section 46 obtains three line profiles (lines L1, L2, and L3) which are different in azimuthal angle. Alternatively, the line profile acquisition section 46 may obtain more than three line profiles which are different in azimuthal angle.

Obtaining profiles of lines extending in radial directions from the center of a diffractogram represented in orthogonal coordinates is equivalent to obtaining profiles of lines extending parallel to the horizontal axis in a diffractogram represented in polar coordinates. The line profile acquisition section 46 may draw lines parallel to the horizontal axis of a diffractogram represented in polar coordinates and obtain profiles of the lines.

Figure 8:
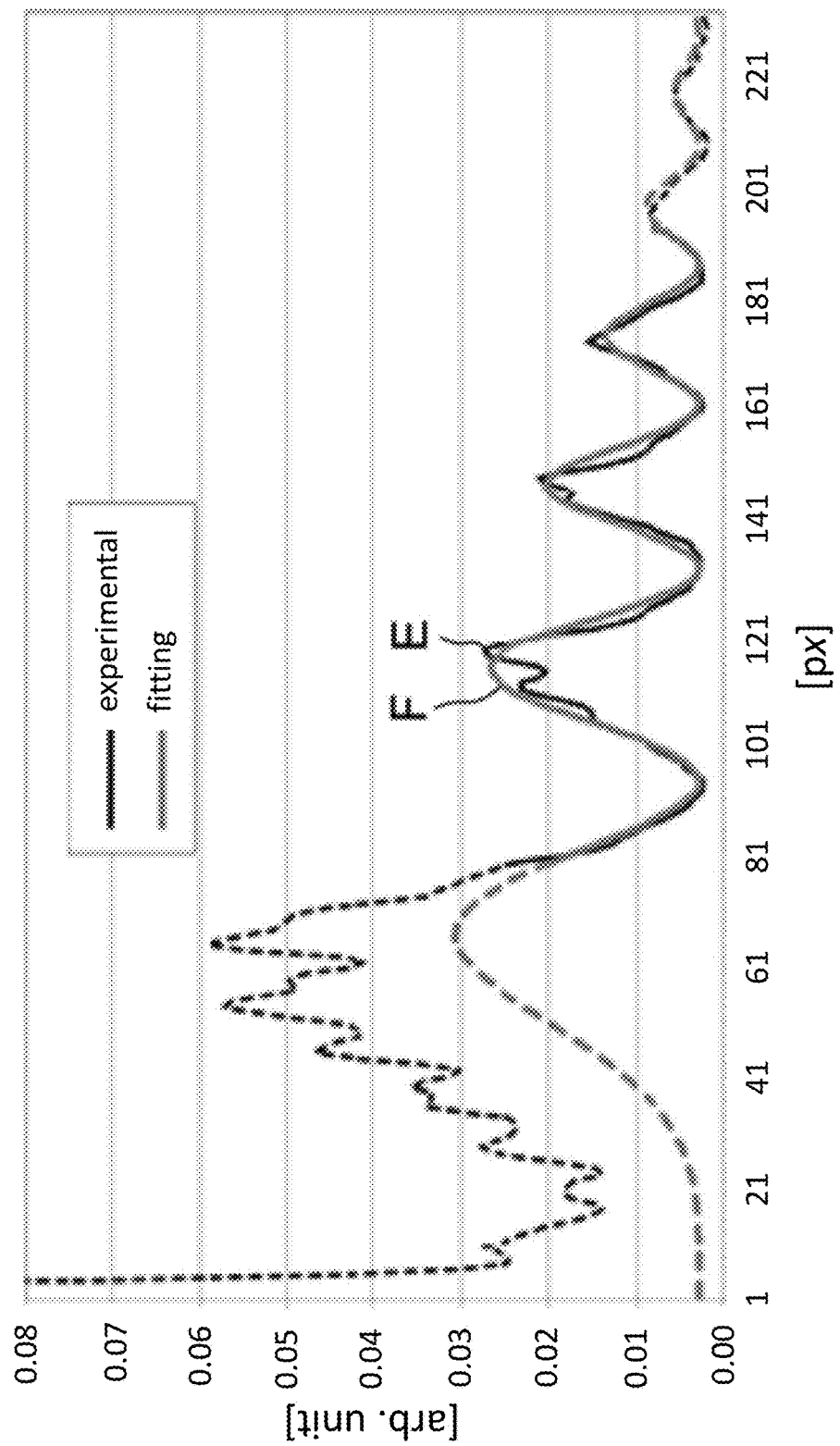
FIG. 8 is a graph showing line profiles of a diffractogram taken in radial directions and one example of fitting function.

The fitting section 48 fits the radially extending line profiles of the diffractogram obtained by the line profile acquisition section 46 to a fitting function to obtain fitting parameters of the fitting function. FIG. 8 is a graph showing the radially extending line profiles E of the diffractogram, as well as one example of the fitting function F. In FIG. 8, the horizontal axis indicates positions, while the vertical axis indicates intensities. The solid lines of the line profiles E and fitting function F shown in FIG. 8 are used for the fitting, whereas the broken lines are not used for the fitting.

The fitting section 48 fits the line profiles by a nonlinear least squares method. A function including a contrast transfer function is used as the fitting function. The contrast transfer function indicates the contributing weights of individual frequency components of the sample to the image. Where the sample is represented by an approximation to a weakly phased object, the contrast transfer function is indicated by a sine function that depends on defocus and spherical aberration. The manner how high-frequency information is lost due to lack of spatial coherence and temporal coherence is indicated by an envelope function and a sine function is multiplied by this envelope function. The effect of a lens of an electron microscope on image contrast is indicated by this contrast transfer function.

In particular, a fitting function is given, for example, by $$A \cdot \mathrm{Exp}(-Bx^4)\sin^2(\pi df \lambda x^2) + f(x) \tag{1}$$

where A, B, and df are fitting parameters, π is the circumference ratio, λ is the wavelength of an electron beam, and x indicates a position. As given by Eq. (1), a fitting function includes a contrast transfer function and a term corresponding to the background. The background function f(x) has been previously found by a separate method. Alternatively, the background function may also be found as $f(x)=C \cdot \mathrm{Exp}(-D \cdot x^2)$ (where C and D are fitting parameters) by a fitting technique simultaneously with the contrast transfer function.

Note that the term of the contrast transfer function contained in the fitting function is not restricted to $A \cdot \mathrm{Exp}(-Bx^4) \sin^2(\pi df \lambda x^2)$ of Eq. (1) above. For example, the following formulas can be used as the contrast transfer function included in the fitting function.

$$A \cdot \mathrm{Exp}(-Bx^2)\sin^2(\pi df \lambda x^2)$$

$$A \cdot \mathrm{Exp}(-(Bx^2+Cx^4))\sin^2(\pi df \lambda x^2 + Dx^4)$$

$$A \cdot \mathrm{Exp}(-(Bx+Cx^3)^2)(\sin^2(\pi df \lambda x^2) + D\cos^2(\pi df \lambda x^2))$$

$$A \cdot \mathrm{Exp}(-Bx^2)(\sin(\pi df \lambda x^2) + C\cos(\pi df \lambda x^2))^2$$

where A, B, C, D, and df are fitting parameters.

The fitting section 48 fits the line profiles E to the fitting function and finds the fitting parameters df of the fitting function, which in turn, is used in the computing section 49 to find defocus and two-fold astigmatism.

In the line profiles E shown in FIG. 8, the peak regions of the profiles contain numerous uncertainties such as information about scattering by the sample and, therefore, it is difficult to fit the peak regions to a correct fitting function. For this reason, the fitting section 48 fits valley regions and their vicinities of the line profiles E to a fitting function. In particular, the fitting section 48 performs the fitting operation by assigning weights, for example, inversely proportional to the intensity value of a diffractogram or inversely proportional to the square of the intensity value of the diffractogram and using a least squares method. Consequently, the valley regions and their vicinities of the line profiles E can be fitted to a fitting function. In the line profiles E shown in FIG. 8, the valley regions of the line profiles E are the positions of local minima and their vicinities. The peak regions of the line profiles E are the positions of local maxima and their vicinities.

The fitting section 48 may operate to subtract the background level from the line profiles before the fitting operation.

The fitting section 48 finds the fitting parameters df respectively for the line profiles of the plural lines L1, L2, and L3 which are different in azimuthal angle by the above-described procedure. In the illustrated example, three fitting parameters df are found, because the fitting section 48 finds the fitting parameters df for the three lines L1, L2, and L3 which are different in azimuthal angle. The computing section 49 finds an amount of defocus and two-fold astigmatism, based on the plural fitting parameters df found by the fitting section 48.

A fitting parameter $df_\theta$ at an azimuthal angle $\theta$, an amount of defocus O2, two-fold astigmatism $A2_{amp}$ (intensity), and $A2_{azm}$ (azimuthal angle) have a relation given by $$df_\theta = O2 + A2_{comp} \cos(2(A2_{azm} - \theta)) \qquad (2)$$

The computing section 49 finds an amount of defocus O2, two-fold astigmatism $A2_{amp}$, $A2_{azm}$ using Eq. (2) from the three fitting parameters $df\theta$ (df) found by the fitting section 48.

The processing section 40 operates to send information about the amount of defocus O2 and two-fold astigmatism $A2_{amp}$, $A2_{azm}$ found by the computing section 49 to the aberration corrector controller 32. The processing section 40 may also operate to provide a display of the information about the amount of defocus O2 and two-fold astigmatism $A2_{amp}$, $A2_{azm}$ found by the computing section 49 on the display device 52.

The aberration computing device 4 does not need to have the image processor 44. That is, the line profile acquisition section 46 may obtain line profiles directly from a diffractogram created by the diffractogram generator 42.

The aberration computing device 4 and the electron microscope 100 have the following features. In the aberration computing device 4, the fitting section 48 fits the line profiles of the diffractogram in radial directions to a fitting function and finds fitting parameters of the fitting function. The computing section 49 finds at least one of an amount of defocus and two-fold astigmatism, based on the fitting parameters. Therefore, the aberration computing device 4 can find an amount of defocus and two-fold astigmatism without performing higher-order computations. Thus, the aberration computing device 4 can reduce the amount of computation compared with the case where higher-order computations are performed to find an amount of defocus and two-fold astigmatism. The computation for finding an amount of defocus and two-fold astigmatism can be accelerated.

In the aberration computing device 4, the fitting section 48 fits the valley regions and their vicinities of line profiles to a fitting function. The fitting parameters df used for measurement of defocus and two-fold astigmatism depends mainly on the profile portions in the valley regions of the line profiles. Therefore, the aberration computing device 4 can find the fitting parameters df accurately by fitting the valley regions and their vicinities of the profiles to a fitting function. Consequently, the aberration computing device 4 can accurately find an amount of defocus and two-fold astigmatism.

In the aberration computing device 4, the fitting section 48 performs the fitting operation by a least squares method while assigning weights inversely proportional to the intensity of a diffractogram or inversely proportional to the square of the intensity. In consequence, valley regions and their vicinities of the diffractogram can be fitted. As a result, the fitting parameters df can be found accurately.

In the aberration computing device 4, the fitting section 48 finds fitting parameters respectively for the plural line profiles which are different in azimuthal angle. The computing section 49 finds at least one of an amount of defocus and two-fold astigmatism, based on the plural fitting parameters found by the fitting section 48. Consequently, the aberration computing device 4 can accurately find an amount of defocus and two-fold astigmatism.

In the aberration computing device 4, the image processor 44 filters the diffractogram in a circumferential direction. However, where a diffractogram is filtered isotropically (e.g., low pass filtered isotropically) in an attempt to increase the S/N of the diffractogram, the concentric rings of the diffractogram may be blurred. If so, the positions of the rings will deviate in radial directions. In this case, if line profiles are taken from the center of a diffractogram in radial directions, the profiles will vary.

In contrast, in the aberration computing device 4, a diffractogram is filtered in a circumferential direction and so the positions of the rings can be suppressed from deviating in radial directions compared with the case where the diffractogram is filtered isotropically. Where a diffractogram is filtered isotropically, the rings may sometimes be blurred, deteriorating the contrast. In contrast, where a diffractogram is filtered in a circumferential direction, regions of nearly equal intensity blur together. As a result, high contrast can be maintained. Consequently, the aberration computing device 4 can improve the S/N of the diffractogram while suppressing the positions of the rings from deviating in radial directions. Hence, the aberration computing device 4 can find an amount of defocus and two-fold astigmatism accurately.

In the aberration computing device 4, the image processor 44 transforms a diffractogram into polar coordinates and convolves the diffractogram in polar coordinate representation with an anisotropic filter function. This permits the diffractogram to be filtered in a circumferential direction. Consequently, the positions of the rings can be suppressed from deviating in radial directions compared with the case where the diffractogram is filtered isotropically.

As described previously, the aberration computing device 4 can promote and make more accurate the computation for finding an amount of defocus and two-fold astigmatism and so temporal changes of an amount of defocus or two-fold astigmatism can be measured as one index in judging the stability of the instrument. Furthermore, the aberration computing device 4 can measure higher-order aberrations at higher speeds and more accurately, for example, by the use of a diffractogram tableau, because the aberration computing device 4 can perform a computation for finding an amount of defocus and two-fold astigmatism at higher speeds and more accurately.

Since the electron microscope 100 includes the aberration computing device 4, the computation for finding an amount of defocus and two-fold astigmatism can be performed at higher speed and more accurately. Accordingly, the electron microscope 100 can correct aberrations at higher speeds and with improved accuracy.

1.2. Method of Computing Aberrations

Figure 9:
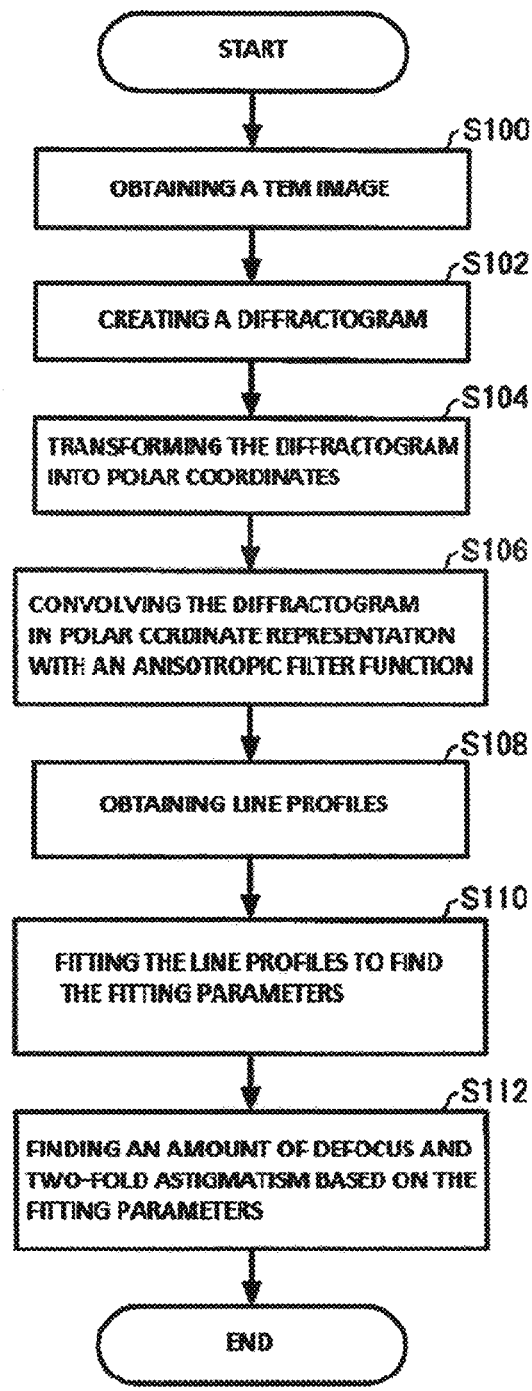
FIG. 9 is a flowchart illustrating one example of aberration computing method using the aberration computing device associated with the first embodiment.

A method of computing aberrations by the use of the aberration computing device 4 associated with the first embodiment is next described by referring to the flowchart of FIG. 9 which illustrates one example of the aberration computing method using the aberration computing device 4.

The aberration computing device 4 obtains a TEM image of the amorphous sample S captured by the electron microscope body 2 (step S100). In particular, the aberration computing device 4 receives the output signal from the imager 22 which indicates information about the TEM image, and obtains the TEM image. The information about the TEM image is stored, for example, in the storage device 54.

Then, the diffractogram generator 42 Fourier transforms the TEM image of the amorphous sample S to create a diffractogram (see FIG. 2) (step S102).

Then, the image processor 44 operates such that the diffractogram created by the diffractogram generator 42 is filtered in a circumferential direction (steps S104 and S106). In particular, the image processor 44 transforms the diffractogram represented in orthogonal coordinates into polar coordinates as shown in FIG. 3 (step S104).

The image processor 44 then convolves the diffractogram in polar coordinate representation with an anisotropic filter function extending along the horizontal axis as shown in FIG. 4 (step S106). Consequently, the diffractogram represented in polar coordinates can be filtered along the horizontal axis (see FIG. 5). The image processor 44 then retransforms the polar coordinate diffractogram filtered along the horizontal axis back into a diffractogram represented in orthogonal coordinates (see FIG. 6).

The line profile acquisition section 46 then obtains three line profiles of the lines L1, L2, and L3 of the diffractogram in radial directions which are different in azimuthal angle θ as shown in FIG. 7 (step S108).

The fitting section 48 then fits the line profiles obtained by the line profile acquisition section 46 to a fitting function to find the fitting parameters df of the fitting function respectively for the line profiles (step S110). The fitting function includes a contrast transfer function. For example, the fitting section 48 performs the fitting operation by a least squares method in which weights inversely proportional to the intensity of the diffractogram or inversely proportional to the square of the intensity are assigned.

Then, the computing section 49 finds an amount of defocus and two-fold astigmatism, using Eq. (2), based on the three fitting parameters df found by fitting section 48 (step S112).

Because of the processing described so far, an amount of defocus and two-fold astigmatism can be found.

The aberration computing method using the aberration computing device 4 has the following features. This method includes the steps of: fitting line profiles of a diffractogram taken in radial directions to a fitting function to find fitting parameters of the fitting function; and computing at least one of an amount of defocus and two-fold astigmatism based on the fitting parameters. Therefore, the amount of computation can be reduced as compared to the case where higher-order computations are performed to find an amount of defocus and two-fold astigmatism. Also, the computation for finding the amount of defocus and two-fold astigmatism can be accelerated.

In the aberration computing method using the aberration computing device 4, during the fitting step, valley regions and their vicinities of line profiles are fitted to a fitting function and so the fitting parameters df necessary for measurement of an amount of defocus and two-fold astigmatism can be found accurately. Consequently, an amount of defocus and two-fold astigmatism can be found accurately.

Furthermore, in the aberration computing method using the aberration computing device 4, the fitting step is carried out by a least squares method in which weights inversely proportional to the intensity of a diffractogram or inversely proportional to the square of the intensity are assigned. This permits valley regions and their vicinities of the diffractogram to be fitted to a fitting function. Thus, the fitting parameters df can be found accurately.

In the aberration computing method using the aberration computing device 4, during the fitting step, fitting parameters df are found respectively for the plural line profiles which are different in azimuthal angle. During the computing step, at least one of an amount of defocus and two-fold astigmatism is found, based on the plural fitting parameters df found by the fitting step. Therefore, the amount of defocus and two-fold astigmatism can be found more accurately.

Further, in the aberration computing method using the aberration computing device 4, during the image processing step, the diffractogram is filtered in a circumferential direction. Consequently, the SN of the diffractogram can be improved while suppressing the positions of the rings from deviating in radial directions as compared to the case where the diffractogram is filtered isotropically.

Additionally, in the aberration computing method using the aberration computing device 4, during the image processing step, the diffractogram is transformed into polar coordinates and convolved with an anisotropic filter function. This permits the diffractogram to be filtered in a circumferential direction. The positions of the rings can be suppressed from deviating in radial directions as compared to the case where the diffractogram is filtered isotropically.

1.3. Modification of Aberration Computing Device

A modification of the aberration computing device associated with the first embodiment is next described. The aberration computing device associated with the present modification is similar in configuration to the aberration computing device 4 associated with the first embodiment and shown in FIG. 1. Only the differences with the aberration computing device 4 are described below.

In the above-described aberration computing device 4 associated with the first embodiment, the image processor 44 transforms a diffractogram into polar coordinates and convolves the diffractogram in polar coordinate representation with an anisotropic filter function to thereby filter the diffractogram in a circumferential direction.

On the other hand, in the aberration computing device 4 associated with the present modification, the image processor 44 finds two-fold astigmatism in a diffractogram, normalizes the diffractogram with the two-fold astigmatism, and transforms the normalized diffractogram into polar coordinates. For example, the image processor 44 finds two-fold astigmatism in a diffractogram, normalizes the diffractogram with the two-fold astigmatism, then transforms the normalized diffractogram into polar coordinates, and convolves the diffractogram in polar coordinate representation with an anisotropic filter function. As a result, the diffractogram can be filtered in a circumferential direction.

Filtering a diffractogram in a circumferential direction is that the diffractogram is filtered along the contours of the rings of the diffractogram. Accordingly, where the rings of the diffractogram are concentric, the image processor 44 can filter the diffractogram in a circumferential direction, i.e., along the circumference. Where the rings are concentrically elliptical, the image processor 44 can filter the diffractogram elliptical circumferentially, i.e., along plural ellipses sharing the common center.

Figure 10:
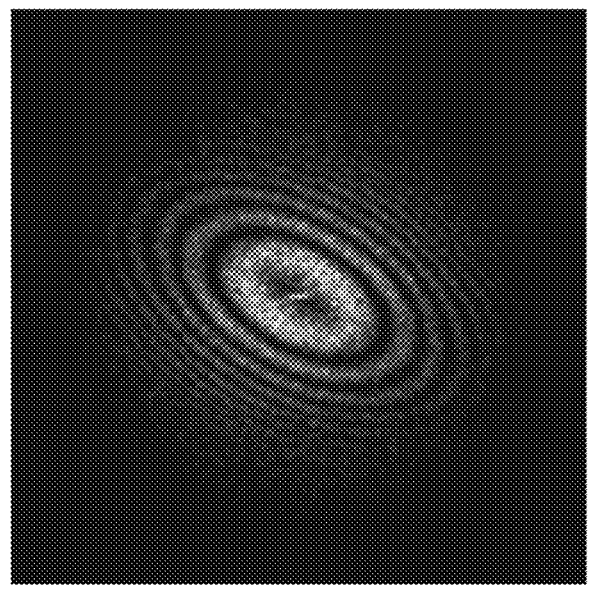
FIG. 10 shows a diffractogram having concentrically elliptical rings.
Figure 11:
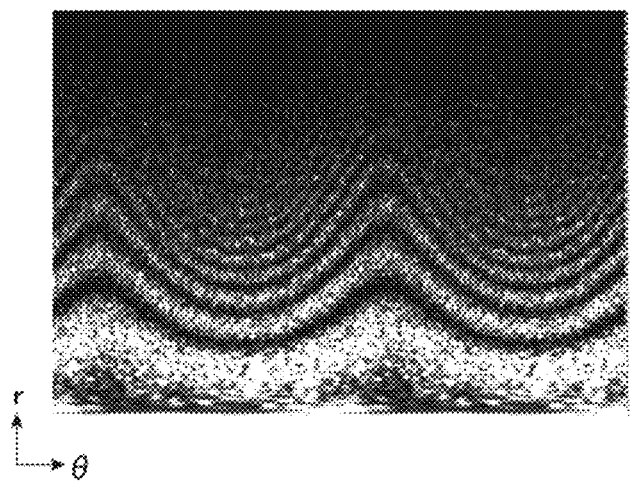
FIG. 11 shows one example of diffractogram obtained by transforming a diffractogram having concentrically elliptical rings into polar coordinates.

The processing performed by the image processor 44 associated with the present modification is described in detail below by referring to FIGS. 10 and 11. FIG. 10 shows one example of a diffractogram having concentrically elliptical rings. FIG. 11 shows one example of a diffractogram obtained by transforming a diffractogram having concentrically elliptical rings into polar coordinates.

Where there is two-fold astigmatism, a diffractogram has rings which draw concentric ellipses as shown in FIG. 10. Therefore, if a diffractogram whose rings are concentrically elliptical is transformed into polar coordinates, belt-like lines assume a wavy state instead of extending straight along the horizontal axis as shown in FIG. 11. Therefore, if a diffractogram having concentrically elliptical rings is transformed into polar coordinates and convolved with an anisotropic filter function (such as a filter function shown in FIG. 4), then cylindrically symmetric aberration components are added to the two-fold astigmatism to thereby vary the profiles in radial directions. This may deteriorate the measuring accuracy.

Figure 12:
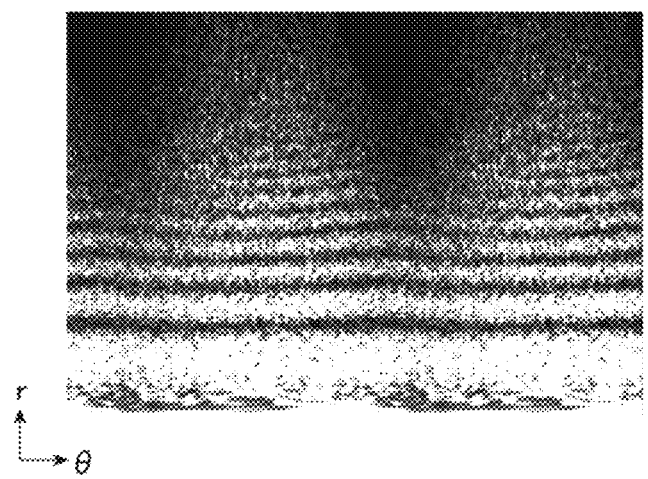
FIG. 12 shows one example of diffractogram obtained by transforming a diffractogram normalized with two-fold astigmatism into polar coordinates.

On the other hand, in the image processor 44 associated with the present modification, two-fold astigmatism in a diffractogram is found, the diffractogram is normalized with the two-fold astigmatism, and the normalized diffractogram is transformed into polar coordinates. Consequently, a diffractogram having concentrically elliptical rings can be varied into a diffractogram having concentric rings. The image processor 44 transforms the diffractogram normalized with this two-fold astigmatism into polar coordinates and thus the belt-like lines can be varied into lines extending straight along the horizontal axis without assuming a wavy state as shown in FIG. 12. Therefore, if the image processor 44 transforms a diffractogram into polar coordinates and convolves the diffractogram with an anisotropic filter function, it is possible to prevent addition of cylindrically symmetrical aberration components to the two-fold astigmatism component; otherwise, the profiles in radial directions would vary and the measuring accuracy would deteriorate. The processing performed by the image processor 44 is described in further detail below.

The image processor 44 convolves a diffractogram having concentrically elliptical rings with an isotropic filter function, the diffractogram being created by the diffractogram generator 42. Consequently, the S/N of the diffractogram can be improved.

The image processor 44 takes line profiles of the diffractogram convolved with the isotropic filter function and finds a first zero point. The line profiles can be obtained by drawing lines extending from the center of the diffractogram in radial directions and taking profiles of these drawn lines. The first zero point is a wave number at which the contrast transfer function initially crosses an axis at zero level. In the example shown in FIG. 8, the wave number of the first valley (local minimum value) of each profile is the wave number of the first zero point.

The image processor 44 finds defocus and two-fold astigmatism from the found wave number of the first zero point and normalizes a diffractogram having concentrially elliptical rings such that the amount of variation of each ring from a true circle is normalized with the two-fold astigmatism. In other words, the image processor 44 normalizes the radial-direction components of the diffractogram with the two-fold astigmatism. That is, the image processor 44 normalizes the diffractogram having concentrically elliptical rings with the two-fold astigmatism such that the rings are made concentric. In this way, the concentrically elliptical rings of the diffractogram can be made concentric.

The image processor 44 transforms the normalized diffractogram into polar coordinates and convolves the diffractogram in polar coordinate representation with an anisotropic filter function (such as a filter function shown in FIG. 4). The image processor 44 then retransforms the filtered diffractogram in polar coordinate representation back to an orthogonal coordinate representation. Because of the processing described so far, a diffractogram having concentrically elliptical rings can be filtered along the ellipses.

The image processor 44 may normalize the diffractogram with the two-fold astigmatism and, at the same time, transform the diffractogram into polar coordinates. Consequently, the computation can be performed more efficiently than the case where the normalization of the diffractogram with the two-fold astigmatism and the transformation into polar coordinates are performed separately as described previously.

The computing section 49 of the aberration computing device 4 associated with the present modification finds the fitting parameters df, taking account of the variations of the lengths of the rings caused by the normalization performed by the image processor 44.

In the present modification, the image processor 44 finds two-fold astigmatism in a diffractogram, normalizes the diffractogram with the two-fold astigmatism, and transforms the normalized diffractogram into polar coordinates. Therefore, if the diffractogram has concentrically elliptical rings, the diffractogram can be filtered circumferentially of the rings. Consequently, the SN of the diffractogram can be improved efficiently.

Figure 13:
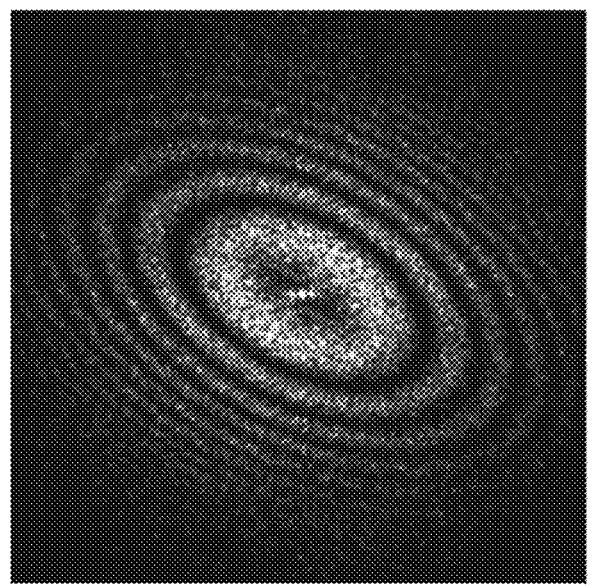
FIG. 13 shows one example of diffractogram having concentrically elliptical rings.
Figure 14:
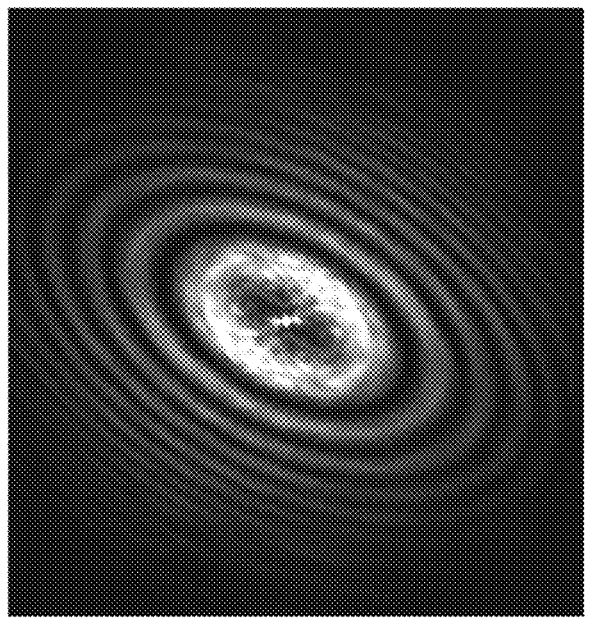
FIG. 14 shows one example of diffractogram filtered in a circumferential direction of its concentric rings.
Figure 15:
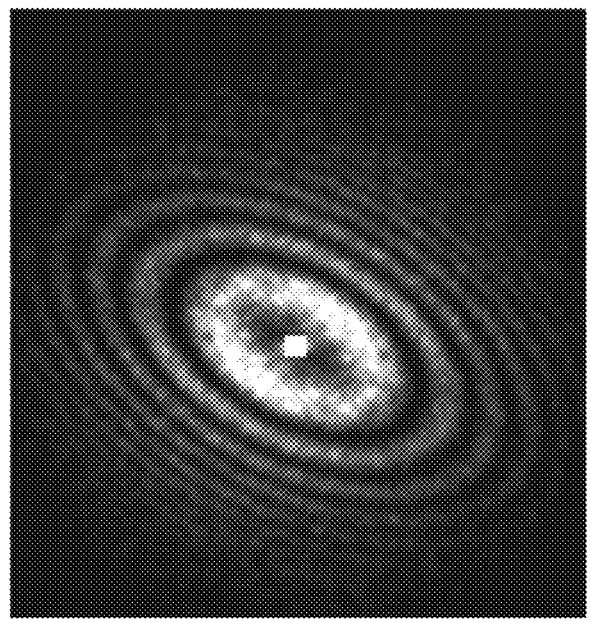
FIG. 15 shows one example of diffractogram filtered isotropically.

FIG. 13 shows one example of diffractogram having concentrically elliptical rings. FIG. 14 shows one example of diffractogram filtered circumferentially of the concentrically elliptical rings. FIG. 15 shows one example of diffractogram filtered isotropically.

In the present modification, the diffractogram having the concentrically elliptical rings as shown in FIG. 13 can be filtered along the ellipses as shown in FIG. 14 by the image processor 44 as described previously.

The diffractogram filtered along the ellipses as shown in FIG. 14 has the rings blurred to a lesser extent in radial directions than the rings of the diffractogram low pass filtered isotropically as shown in FIG. 15. Therefore, the positions of the rings of the diffractogram filtered along the ellipses as shown in FIG. 14 can be suppressed from deviating in radial directions as compared to those of the diffractogram low pass filtered isotropically as shown in FIG. 15.

Figure 16:
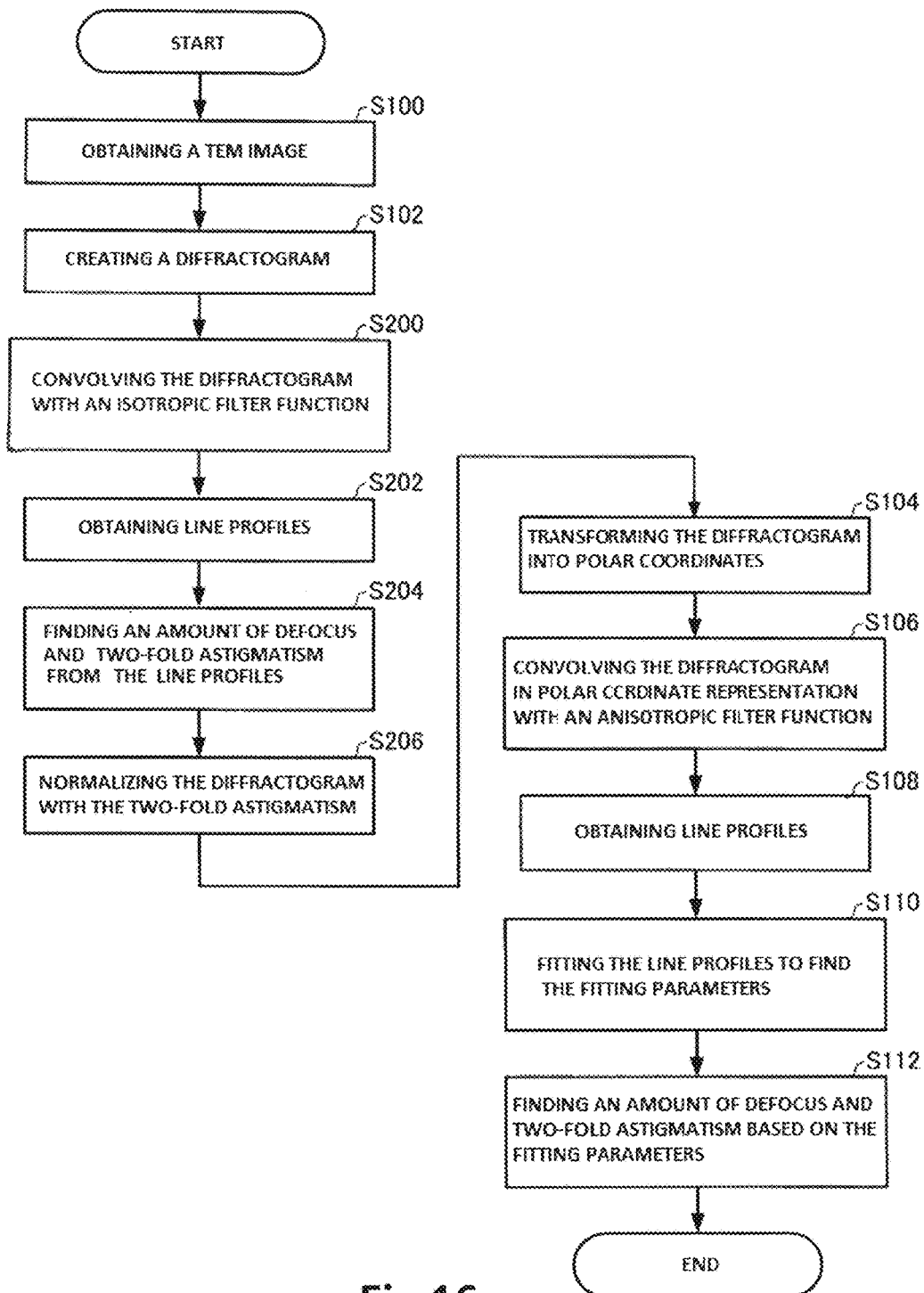
FIG. 16 is a flowchart illustrating one example of an aberration computing method using an aberration computing device associated with a modification of the first embodiment.

An aberration computing method using the aberration computing device associated with the present modification is next described by referring to FIG. 16, which is a flowchart illustrating one example of aberration computing method using the aberration computing device associated with the present modification. Those steps of the flowchart of FIG. 16 which are similar in operation to their respective steps of the flowchart of FIG. 9 are indicated by the same reference numerals as in FIG. 9 and a description thereof is omitted.

After the diffractogram generator 42 creates a diffractogram having concentrically elliptical rings (step S102), the image processor 44 convolves the diffractogram with an isotropic filter function (step S200).

Then, the image processor 44 takes line profiles of the diffractogram convolved with the isotropic filter function (step S202). The image processor 44 then finds the values of the first zero points from the line profiles and finds an amount of defocus and two-fold astigmatism (step S204).

The image processor 44 then normalizes the diffractogram having the concentrically elliptical rings with the found two-fold astigmatism and makes the rings of the diffractogram concentric (step S206).

The following steps S104, S106, S108, S110, and S112 are similar to their respective steps of the above-cited FIG. 9 except that in step S110, the computing section 49 finds the fitting parameters df, taking account of the variations of the lengths of the rings caused by the normalization performed by the image processor 44. Because of the processing described so far, an amount of defocus and two-fold astigmatism can be found.

The image processor 44 may normalize the diffractogram with the two-fold astigmatism (step S206) and, at the same time, transform the diffractogram into polar coordinates (step S104).

In the present modification, during the image processing step, two-fold astigmatism in a diffractogram is found, the diffractogram is normalized with the two-fold astigmatism, and the diffractogram is transformed into polar coordinates. Therefore, if the diffractogram has concentrically elliptical rings, the diffractogram can be filtered circumferentially of the rings. The SN of the diffractogram can be improved at high efficiency.

2. Second Embodiment

Figure 17:
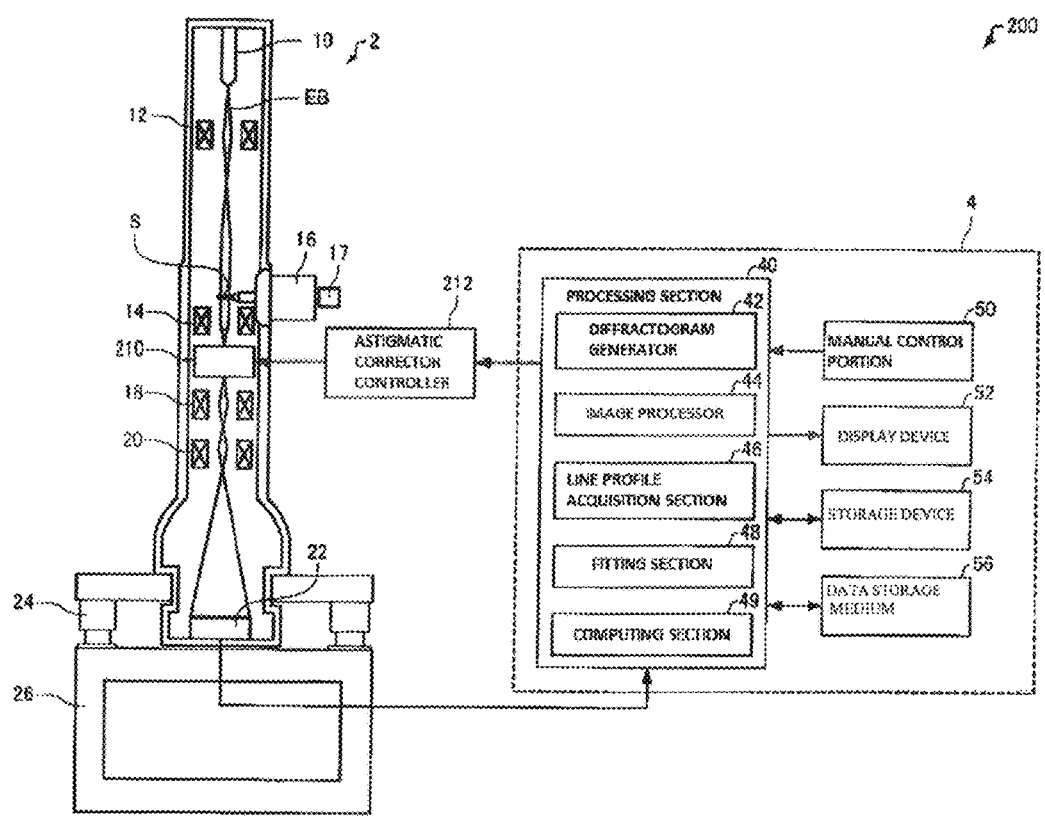
FIG. 17 is a vertical cross section, partly in block form, of an electron microscope associated with a second embodiment of the present invention.

An electron microscope associated with a second embodiment of the present invention is next described by referring to FIG. 17, which schematically shows the configuration of the electron microscope, 200, associated with the second embodiment. Those members of the electron microscope 200 associated with the second embodiment which are similar in function to their respective counterparts of the above-described electron microscope 100 associated with the first embodiment are indicated by the same reference numerals as in the above-cited FIG. 1 and a description thereof is omitted.

The above-described electron microscope 100 has the aberration corrector 30 and the aberration corrector controller 32 as shown in FIG. 1. The corrector controller 32 controls the aberration corrector 30 based on the amount of defocus and two-fold astigmatism found by the aberration computing device 4 and corrects higher-order aberrations such as spherical aberration.

On the other hand, the electron microscope 200 has an astigmatic corrector 210 and an astigmatic corrector controller 212 as shown in FIG. 17. The corrector controller 212 controls the astigmatic corrector 210 based on the two-fold astigmatism found by the aberration computing device 4 and corrects two-fold astigmatism.

The astigmatic corrector 210 is located behind the objective lens 14. More specifically, the astigmatic corrector 210 is disposed between the objective lens 14 and the intermediate lens 18. The corrector 210 has a quadrupole consisting, for example, of four electromagnetic coils placed symmetrically with respect to the optical axis. Two-fold astigmatism in the objective lens 14 is corrected by varying the focal distances in mutually perpendicular two directions.

The astigmatic corrector controller 212 receives an output signal from the aberration computing device 4 which indicates information about the two-fold astigmatism and creates a control signal for canceling out the two-fold astigmatism from the information about the two-fold astigmatism. The corrector controller 212 outputs the created control signal to the astigmatic corrector 210.

Alternatively, the aberration computing device 4 may output information about the found amount of defocus to an objective lens controller (not shown), which in turn may control the objective lens 14 based on the information about the amount of defocus, thus adjusting the amount of defocus. Furthermore, the aberration computing device 4 may output the information about the found amount of defocus to the sample stage 16. The sample stage 16 may vary the height of the sample S based on the information about the amount of defocus, thus adjusting the amount of defocus.

Since the electron microscope 200 includes the aberration computing device 4, an amount of defocus and two-fold astigmatism can be calculated at higher speed and with improved accuracy. Accordingly, the electron microscope 200 can correct astigmatism at higher speed and at improved accuracy.

3. Third Embodiment 3.1. Image Processor and Electron Microscope

Figure 18:
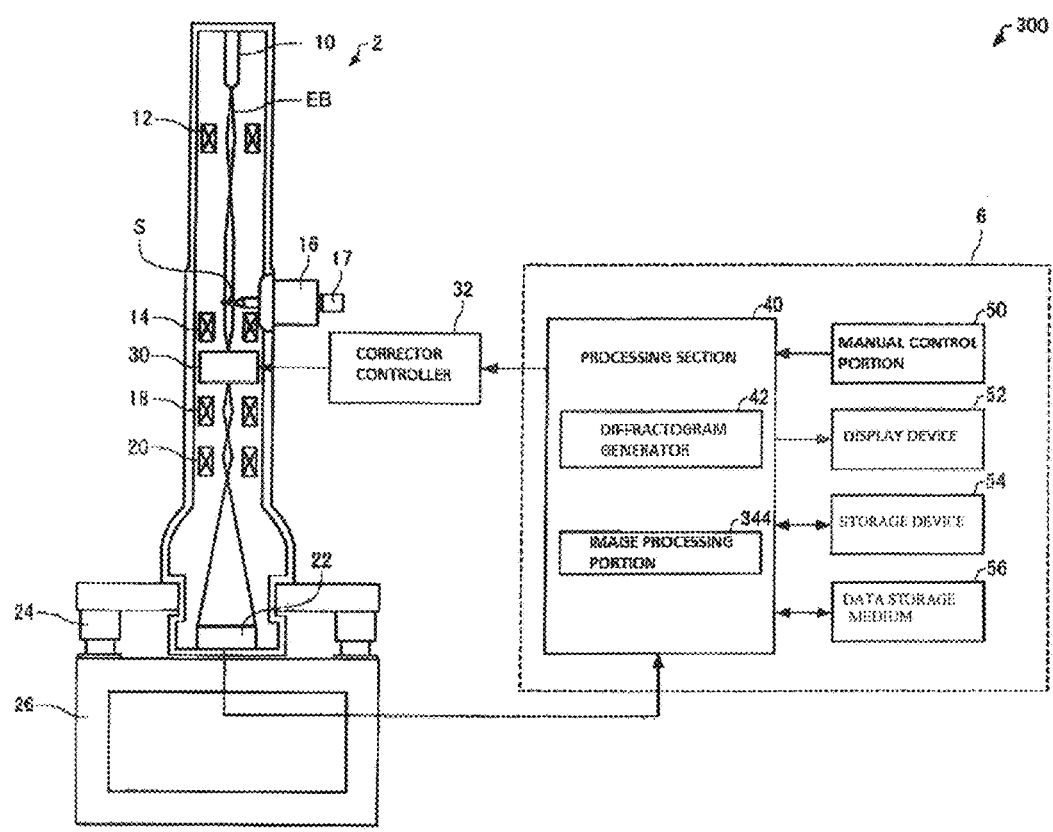
FIG. 18 is a vertical cross section, partly in block form, of an electron microscope including an image processor associated with a third embodiment of the present invention.

An image processor and electron microscope associated with a third embodiment of the present invention is next described by referring to FIG. 18, which schematically shows the configurations of the electron microscope, 300, including the image processor, 6, associated with the third embodiment. Those members of the electron microscope 300 which are similar in function to their respective counterparts of the above-described electron microscope 100 associated with the first embodiment are indicated by the same reference numerals as in the above-cited FIG. 1 and a description thereof is omitted.

As shown in FIG. 18, the electron microscope 300 has an electron microscope body 2 and the image processor 6. The processing section 40 of the image processor 6 operates as a diffractogram generator 42 and an image processing portion 344 by executing computer programs stored in the storage device 54. The processing section 40 includes the diffractogram generator 42 and the image processing portion 344.

In the aberration computing device 4 associated with the first embodiment, the image processor 44 operates such that the diffractogram generated by the diffractogram generator 42 is filtered in a circumferential direction.

In contrast, in the image processor 6 associated with the third embodiment, the image processing portion 344 can filter a diffraction pattern in a circumferential direction, in addition to a diffractogram.

The image processing portion 344 filters a diffraction pattern captured by the electron microscope body 2 in a circumferential direction. Information about the diffraction pattern is output from the imager 22 of the microscope body 2. The image processing portion 344 receives this information about the diffraction pattern and filters the diffraction pattern in a circumferential direction. In particular, the image processing portion 344 transforms the diffraction pattern into polar coordinates and convolves the diffraction pattern in polar coordinate representation with an anisotropic filter function. Consequently, the diffraction pattern can be filtered in a circumferential direction.

Figure 19:
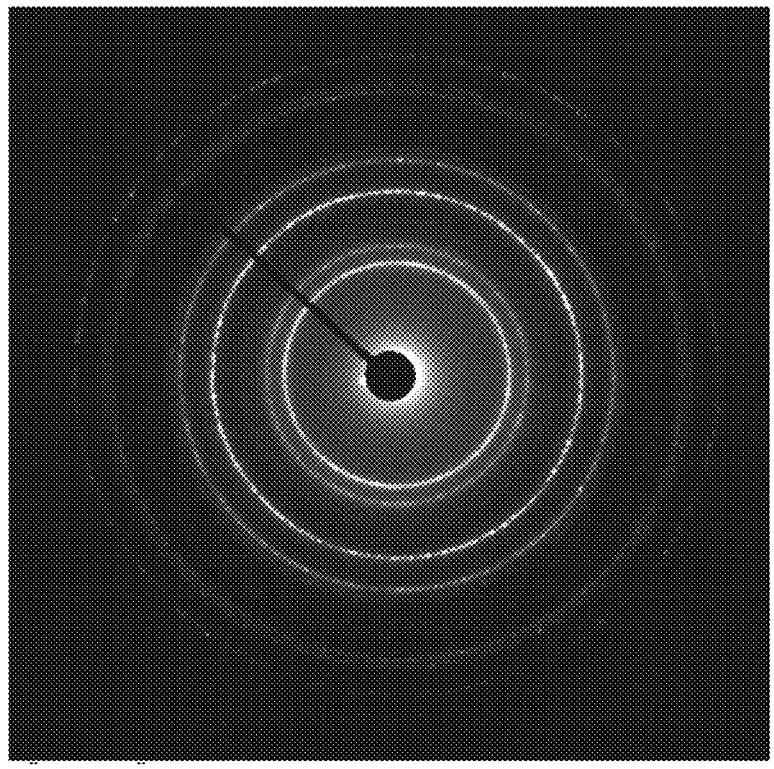
FIG. 19 shows one example of diffraction pattern.

FIG. 19 shows one example of diffraction pattern. The S/N can be improved while suppressing the positions of the rings from deviating in radial directions by filtering Debye-Scherrer rings or halo rings as shown in FIG. 19 in a circumferential direction by means of the image processing portion 344. Debye-Scherrer rings are annular diffraction patterns produced by Bragg reflections intrinsic to some substances and are obtained by irradiating a polycrystalline sample with an electron beam. Halo rings are a blurred annular diffraction pattern obtained by irradiating an amorphous sample with an electron beam, and reflect isotropic atomic arrangements of the amorphous sample having no periodicity.

The image processing portion 344 provides control such that a diffractogram or a diffraction pattern filtered in a circumferential direction is displayed on the display device 52.

The image processor 6 has the following features. In the image processor 6, the image processing portion 344 filters a diffractogram or a diffraction pattern in a circumferential direction. Therefore, the positions of the rings such as concentric rings of a diffractogram, Debye-Scherrer rings or halo rings can be suppressed from deviating in radial directions as compared to the case where a diffractogram, is filtered isotropically. Furthermore, where a diffractogram or a diffraction pattern is filtered isotropically, the rings may be blurred, resulting in a decrease in contrast. In contrast, where a diffractogram or a diffraction pattern is filtered in a circumferential direction, regions of similar intensity blur together and so high contrast can be maintained. Therefore, in the image processor 6, the S/N of a diffractogram can be improved while suppressing the positions of the rings from deviating in radial directions as compared to the case where a diffractogram is filtered isotropically.

In the image processor 6, the image processor 44 transforms a diffractogram or a diffraction pattern into polar coordinates and convolves the diffractogram or diffraction pattern in polar coordinate representation with an anisotropic filter function. Consequently, the diffractogram or diffraction pattern can be filtered in a circumferential direction. The modification applied to the constituents of the aberration computing device 4 associated with the first embodiment is similarly applicable to the image processor 6 associated with the third embodiment.

For example, the image processing portion 344 may find two-fold astigmatism in a diffractogram having concentrically elliptical rings, normalize the diffractogram with the two-fold astigmatism, and transform the normalized diffractogram into polar coordinates. When the diffractogram in polar coordinate representation is retransformed back to the original representation, the image processing portion 344 causes the diffractogram to reflect the two-fold astigmatism component. Because of the processing described so far, a diffractogram having concentrically elliptical rings can be filtered along the ellipses.

In the image processor 6, the image processing portion 344 finds two-fold astigmatism in a diffractogram, normalizes it with the two-fold astigmatism, and transforms the diffractogram into polar coordinates. Therefore, if the diffractogram has concentrically elliptical rings, the diffractogram can be filtered circumferentially of the rings. The S/N of the diffractogram can be improved efficiently.

3.2. Image Processing Method

Figure 20:
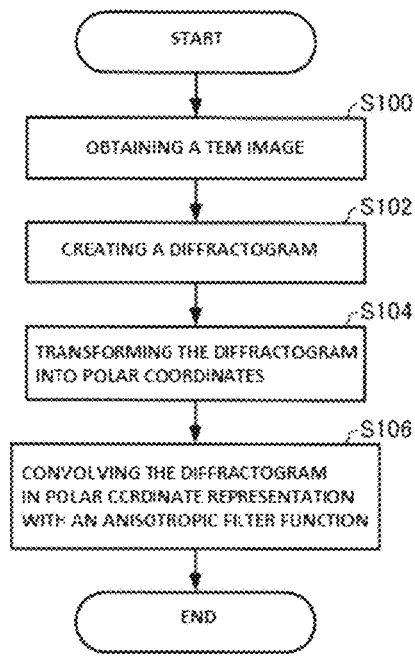
FIG. 20 is a flowchart illustrating one example of image processing method using the image processor associated with the third embodiment of the present invention.

An image processing method using the image processor 6 associated with the third embodiment is next described by referring to FIG. 20, which is a flowchart illustrating one example of the image processing method using the image processor 6. An example in which a diffractogram is filtered in a circumferential direction is described as one example of the image processing method using the image processor 6 associated with the third embodiment.

The image processing method using the image processor 6 comprises the steps of taking a TEM image of the amorphous sample S after the image is captured by the electron microscope body 2 (step S100); Fourier transforming the TEM image of the amorphous sample S by the diffractogram generator 42 to create a diffractogram (step S102); transforming the diffractogram into polar coordinates by the image processor 44 (step S104); and convolves the diffractogram in polar coordinate representation with an anisotropic filter function by the image processor 44 (step S106).

The steps S100, S102, S104, and S106 of the image processing method using the image processor 6 are similar to the steps S100, S102, S104, and S106, respectively, of the aberration computing method using the aberration computing device 4 shown in FIG. 9 and a description thereof is omitted.

The image processing method using the image processing 6 is similar to the above-described method in which a diffractogram is filtered in a circumferential direction except that none of the steps S100 and S102 are performed when a diffraction pattern is filtered in a circumferential direction. At step S100, a diffraction pattern is taken as a TEM image. At step S102, a diffractogram is created.

The image processing method using the image processor 6 has the following features. In the aberration computing method using the image processor 6, during the image processing step, a diffractogram or a diffraction pattern is filtered in a circumferential direction. Therefore, the positions of the rings can be suppressed from deviating in radial directions as compared to the case where a diffractogram or a diffraction pattern is filtered isotropically. Accordingly, the S/N of the diffractogram can be improved while suppressing the positions of the rings from deviating in radial directions.

In the aberration computing method using the image processor 6, during the image processing step, a diffractogram or diffraction pattern is transformed into polar coordinates and convolved with an anisotropic filter function. Consequently, the diffractogram or diffraction pattern can be filtered in a circumferential direction.

The modification applied to the aberration computing method using the aberration computing device 4 associated with the first embodiment is similarly applicable to the image processing method using the image processor 6 associated with the third embodiment. That is, during the image processing step, two-fold astigmatism in a diffractogram may be found, the diffractogram may be normalized with the two-fold astigmatism, and the normalized diffractogram may be transformed into polar coordinates. When the diffractogram in polar coordinate representation is retransformed back to the original representation, the diffractogram is made to reflect two-fold astigmatism component.

In the image processing method using the image processor 6, the image processing portion 344 finds two-fold astigmatism in a diffractogram, normalizes the diffractogram with the two-fold astigmatism, and transforms the normalized diffractogram into polar coordinates. Therefore, if the diffractogram has concentrically elliptical rings, the diffractogram can be filtered circumferentially of the rings. The SN of the diffractogram can be improved efficiently.

The present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

Having thus described my invention with the detail and particularity required by the Patent Laws, what is desired protected by Letters Patent is set forth in the following claims.

The invention claimed is:

1. An aberration correcting microscope comprising:
    a microscope body comprising:
        a lens system configured to produce a magnetic field;
        a sample stage; and
        an aberration corrector; and
    an aberration computing device in communication with the aberration corrector and having a stored program comprising:
        a fitting section for fitting line profiles of a diffractogram taken in radial directions to a fitting function and finding fitting parameters of the fitting function; and
        a computing section for finding at least one of an amount of defocus and two-fold astigmatism, based on the fitting parameters,
        wherein said fitting section fits valley regions and their vicinities of said line profiles to the fitting function,
        wherein said fitting section carries out the fitting by a least squares method by assigning weights inversely proportional to the intensity of the diffractogram or inversely proportional to the square of the intensity, and
    wherein the aberration computing device communicates a control signal to the aberration corrector to produce a correcting magnetic field based on the amount of defocus and/or two-fold astigmatism.

2. The aberration correcting microscope set forth in claim 1, wherein said fitting function includes a contrast transfer function.

3. The aberration correcting microscope as set forth in claim 1, wherein said fitting section finds said fitting parameters respectively for said line profiles which are different in azimuthal angle, and wherein said computing section finds at least one of an amount of defocus and two-fold astigmatism, based on said fitting parameters found by the fitting section.

4. The aberration correcting microscope as set forth in claim 1, further comprising an image processor for filtering said diffractogram in a circumferential direction.

5. The aberration correcting microscope as set forth in claim 4, wherein said image processor transforms said diffractogram into polar coordinates and convolves the diffractogram in polar coordinate representation with an anisotropic filter function.

6. The aberration correcting microscope as set forth in claim 1, wherein the microscope comprises an electron microscope.

7. The aberration correcting microscope as set forth in claim 1, wherein the correcting magnetic field is configured to correct an aberration associated with the lens system.

8. An aberration correcting microscope comprising:
    a microscope body comprising:
        a lens system configured to produce a magnetic field;
        a sample stage; and
        an aberration corrector; and
    a programmed aberration computing device in communication with the aberration corrector and having a stored program comprising:
        a fitting section for fitting line profiles of a diffractogram taken in radial directions to a fitting function and finding fitting parameters of the fitting function;
        a computing section for finding at least one of an amount of defocus and two-fold astigmatism, based on the fitting parameters; and
        an image processor for filtering said diffractogram in a circumferential direction,
    wherein said image processor transforms said diffractogram into polar coordinates and convolves the diffractogram in polar coordinate representation with an anisotropic filter function,
    wherein said image processor finds two-fold astigmatism in said diffractogram, normalizes the diffractogram with the two-fold astigmatism, and transforms the normalized diffractogram into polar coordinates, and
    wherein the aberration computing device communicates a control signal to the aberration corrector to produce a correcting magnetic field based on the amount of defocus and/or two-fold astigmatism.

9. The aberration correcting microscope as set forth in claim 8, wherein the microscope comprises an electron microscope.

10. The aberration correcting microscope as set forth in claim 8, wherein the correcting magnetic field is configured to correct an aberration associated with the lens system.

* * * * *